(12) United States Patent
Ireland

(10) Patent No.: US 7,345,247 B2
(45) Date of Patent: *Mar. 18, 2008

(54) CIRCUIT BOARD THREADPLATE

(75) Inventor: John A. Ireland, Jasper (CA)

(73) Assignee: Sanmina-SCI Corporation, San Jose, CA (US)

( * ) Notice: Subject to any disclaimer, the term of this patent is extended or adjusted under 35 U.S.C. 154(b) by 432 days.

This patent is subject to a terminal disclaimer.

(21) Appl. No.: 10/264,366

(22) Filed: Oct. 4, 2002

(65) Prior Publication Data

US 2004/0258500 A1 Dec. 23, 2004

(51) Int. Cl.
*H05K 1/11* (2006.01)
*H01R 12/04* (2006.01)

(52) U.S. Cl. ..................... 174/267; 439/876

(58) Field of Classification Search ............... 174/250, 174/260, 261, 262, 263, 267, 65 G, 94 R, 174/166 S; 439/801, 83, 876, 810, 84, 940; 411/171, 180, 427
See application file for complete search history.

(56) References Cited

U.S. PATENT DOCUMENTS

| | | | |
|---|---|---|---|
| 3,339,953 A * | 9/1967 | Bohn | 403/387 |
| 4,452,359 A | 6/1984 | Koppensteiner | |
| 5,065,283 A * | 11/1991 | Adachi et al. | 361/775 |
| 5,426,265 A | 6/1995 | Savage, Jr. | |
| 5,445,450 A | 8/1995 | Hayes et al. | |
| 5,607,313 A * | 3/1997 | Nyman | 439/83 |
| 5,823,729 A * | 10/1998 | Nagayama | 411/429 |
| 6,155,433 A | 12/2000 | Anderson et al. | |
| 6,262,887 B1 | 7/2001 | Lee | |
| 6,278,066 B1 | 8/2001 | Fahlen et al. | |
| 6,347,042 B1 * | 2/2002 | White | 361/784 |
| 6,377,445 B1 * | 4/2002 | Davis et al. | 361/683 |
| 6,456,506 B1 * | 9/2002 | Lin | 361/816 |
| 6,493,233 B1 * | 12/2002 | De Lorenzo et al. | 361/752 |
| 6,637,994 B2 * | 10/2003 | Leistner | 411/181 |
| 6,638,120 B2 * | 10/2003 | Costa | 439/876 |
| 6,769,852 B2 * | 8/2004 | Nilsen et al. | 411/533 |
| 6,850,418 B2 * | 2/2005 | Dutton et al. | 361/752 |
| 6,979,159 B2 * | 12/2005 | Chen | 411/171 |
| 2002/0182028 A1 * | 12/2002 | Hinn-Shing | 411/180 |

FOREIGN PATENT DOCUMENTS

| | | | |
|---|---|---|---|
| GB | 2092694 A | * | 8/1982 |
| JP | 08037356 | | 2/1996 |
| JP | 09284954 | | 10/1997 |
| JP | 200174408 | | 6/2000 |

* cited by examiner

*Primary Examiner*—Ishwar (I. B.) Patel
(74) *Attorney, Agent, or Firm*—Perkins Coie LLP

(57) ABSTRACT

A circuit board threadplate for connection of a component to a circuit board is provided wherein such threadplate may be mechanically mounted to a circuit board without the use of manual labor. Specifically, the threadplate is compatible with present Surface Mount Technology robotic placement machines. Such circuit board threadplate includes a hollow substantially cylindrical member forming an extruded neck having an elongated section and a substantially flat surface at a first end of the elongated section and a flange extending from a second end of the elongated section. The flange provides a substantially flat surface suitable for soldering onto a surface of a circuit board. Additionally, the threadplate includes a cylindrical cavity positioned inside the substantially cylindrical member, extending in a direction aligned with the substantially cylindrical member. The cylindrical cavity may have a thread pattern suitable for receiving a screw-type fastener. Finally, the threadplate includes an opening providing access to the cylindrical cavity.

15 Claims, 5 Drawing Sheets

CIRCUIT BOARD THREADPLATE

BACKGROUND OF THE INVENTION

1. Field of the Invention

The present invention relates generally to circuit board mounting devices and, more specifically, to threaded attachment points used to attach components to a circuit board.

2. Description of the Related Art

Mechanical components, such as, by way of example, face plates, brackets, or other hardware, are commonly attached to circuit boards. Typically, these mechanical components are attached using a screw, nut, and one or more washers, which must be manually assembled. For example, an assembly person will appropriately place a mechanical component on a circuit board. The person will then insert the screw, along with a washer, through the mechanical component and the circuit board, and fasten the nut, along with another washer, to the protruding screw underneath the circuit board.

One major drawback with the aforementioned conventional method of attaching a mechanical component to a circuit board is the need to access both sides of the circuit board to properly attach the mechanical component. It may not be convenient to provide access to the bottom of the motherboard to fasten the nut to the screw during the production process. Another drawback is that the screw, nut, and one or more washers has to be manually assembled, which introduces additional cost and time to the circuit board manufacturing process.

A further drawback to using screws, nuts, and washers to attach mechanical components is the increase in the number of parts that must be inventoried and handled during the manufacturing process. These parts are typically small, and the parts can easily be mishandled. Moreover, these additional parts introduce a further cost and time to the circuit board manufacturing process.

What is desired is an apparatus that will enable a mechanical component to be attached to a circuit without requiring the use of a washer and nut. Furthermore, an apparatus that will enable a mechanical component to be attached to a circuit board without requiring access to an underside of the circuit board is also desired.

SUMMARY OF THE INVENTION

The present disclosure is directed to a threadplate that facilitates the attachment of a mechanical component to a circuit board without requiring the use of a washer and nut. The threadplate substantially reduces or eliminates the disadvantages and problems associated with conventional methods of attaching mechanical components to a circuit board, as described above. Also disclosed is an automated procedure for fastening the threadplate of the present invention to a circuit board.

One technical advantage of the present invention includes providing a threadplate that facilitates the attachment of a mechanical component to a circuit board without requiring a washer and a nut, thus reducing the number of parts that are handled during the manufacturing process. The threadplates of the present invention permit a mechanical component to be attached to a circuit board without requiring access to an underside of the circuit board. Another technical advantage of the present invention includes providing a threadplate suitable for automated fastening to a circuit board and, a method for mechanically fastening the threadplate to the circuit board. The threadplates of the present invention are capable of being quickly and efficiently fastened to a circuit board during a conventional Surface Mount Technology (SMT) process.

A first exemplary embodiment of the present invention comprises a hollow substantially cylindrical member forming an extruded neck having an elongated section and a substantially flat surface at a first end of the elongated section. A flange extends from a second end of the elongated section substantially opposite the first end. Such flange provides a substantially flat surface suitable for soldering onto a surface of a circuit board. Further, the present embodiment provides a cylindrical cavity positioned inside the substantially cylindrical member generally extending in a direction aligned with the substantially cylindrical member and having a thread pattern suitable for receiving a screw-type fastener.

In a second exemplary embodiment a hollow substantially cylindrical member forming an extruded neck having an elongated section and a substantially flat surface at a first end of the elongated section is provided. A flange extends from a second end of the elongated section substantially opposite the first end of the elongated section. Such flange provides a substantially flat surface suitable for soldering onto a surface of a circuit board.

Additionally, the present embodiment provides a cylindrical cavity positioned inside the substantially cylindrical member generally extending in a direction aligned with the substantially cylindrical member and having a thread pattern suitable for receiving a screw-type fastener. Further, such exemplary embodiment comprises a tab extending from a section of the flange suitable for insertion into an opening in the circuit board and operable to be soldered to an underside of the circuit board or to be folded to lie in a position substantially parallel to an underside of the circuit board.

A third exemplary embodiment of the present invention a threadplate as above described is provided wherein either the flange or the extruded neck is suitable for grasping by a SMT placement machine. In a fourth exemplary embodiment, a threadplate, as above described is provided which is suitable for use with a vacuum nozzle equipped SMT placement machine.

A fifth exemplary embodiment of the present invention provides a hollow substantially cylindrical member forming an extruded neck having an elongated section and a substantially flat surface at a first end of the elongated section, wherein said extruded neck is operable to be fitted through an opening in the circuit board. A flange extends from a second end of the elongated section substantially opposite the first end of the elongated section. Such flange provides a substantially flat surface suitable for soldering onto a surface of said circuit board. Further, the present embodiment provides a cylindrical cavity positioned inside the substantially cylindrical member generally extending in a direction aligned with the substantially cylindrical member and having a thread pattern suitable for receiving a screw-type fastener. Such cylindrical cavity extends within such cylindrical member only a portion of said cylindrical member's length.

Additional objects and advantages of the invention are set forth in, or will be apparent to those of ordinary skill in the art from, the detailed description herein. Also, it should be further appreciated that modifications and variations to the specifically illustrated, referenced, and discussed steps, features, materials, or devices hereof may be practiced in various uses and embodiments of this invention without departing from the spirit and scope thereof, by virtue of present reference thereto. Such variations may include, but are not limited to, substitution of equivalent steps, materials, means, or features of those shown, referenced, or discussed, and the functional, operational, or positional reversal of various features, steps, parts, or the like.

Still further, it is to be understood that different embodiments, as well as different presently preferred embodiments, of this invention may include various combinations or configurations of presently disclosed steps, features, or elements, or their equivalents (including combinations of steps or features or configurations thereof not expressly shown in the figures or stated in the detailed description).

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1A:
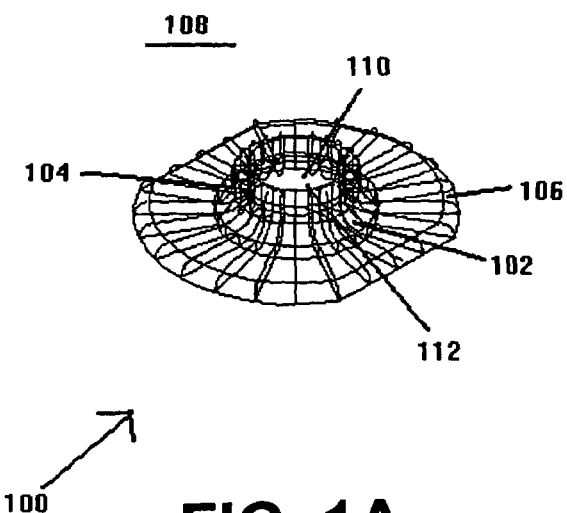
FIG. 1A, FIG. 1B, and FIG. 1C illustrate schematic views of an exemplary threadplate, according to one embodiment.

The elements of the drawings are not necessarily to scale, emphasis instead being placed upon clearly illustrating the principles of the invention. Repeat use of reference characters throughout the present specification and appended drawings is intended to represent the same or analogous features or elements of the invention.

DETAILED DESCRIPTION

Reference will now be made in detail to presently preferred embodiments of the invention, examples of which are fully represented in the accompanying drawings. Such examples are provided by way of an explanation of the invention, not limitation thereof. In fact, it will be apparent to those skilled in the art that various modifications and variations can be made in the present invention, without departing from the spirit and scope thereof. For instance, features illustrated or described as part of one embodiment can be used on another embodiment to yield a still further embodiment. Still further, variations in selection of materials and/or characteristics may be practiced, to satisfy particular desired user criteria. Thus, it is intended that the present invention covers such modifications and variations as come within the scope of the present features and their equivalents.

The present invention provides a circuit board threadplate that facilitates the attachment of a component to a circuit board without requiring the use of a washer and nut nor the manual connection thereof. The threadplate substantially reduces or eliminates the disadvantages and problems associated with conventional methods of attaching mechanical components to a circuit board by allowing the automated attachment of the component to the circuit board utilizing existing SMT placement machines.

Figure 1B:
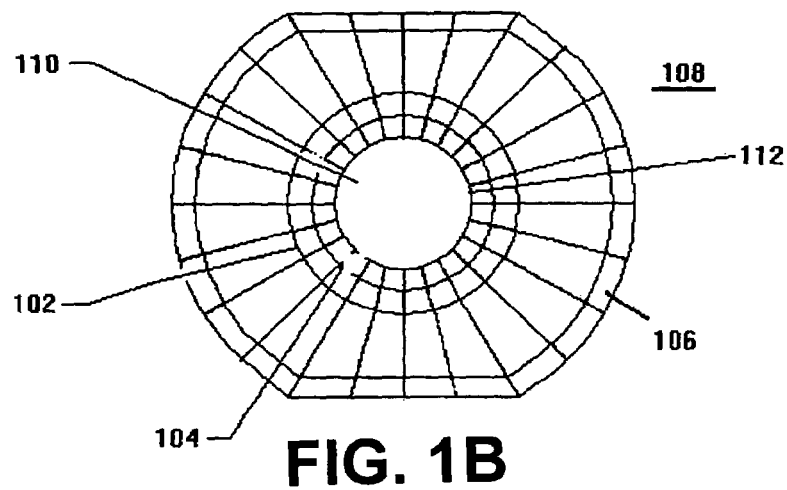
Figure 1C:
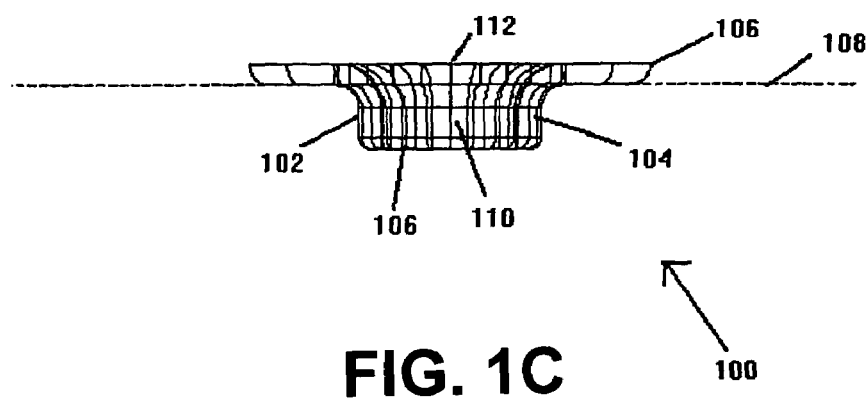

As illustrated in FIGS. 1A, 1B and 1C, a circuit board threadplate 100 is provided which comprises a hollow substantially cylindrical member 102 forming an extruded neck 104. The neck 104 may have an elongated section and a substantially flat surface at a first end thereof and a flange 106 extending from an opposite second end of such elongated section. The flange 106 provides a substantially flat surface suitable for soldering onto a surface of a circuit board 108.

Such threadplate 100 further comprises a cylindrical cavity 110 positioned inside the substantially cylindrical member 102 generally extending in a direction aligned with the substantially cylindrical member 102 and having a thread pattern suitable for receiving a screw-type fastener. Additionally, such threadplate 100 comprises an opening 112 that provides access to the cylindrical cavity 110. Such opening 112 can be either on a side of the flange 106 opposite the extruded neck 104 or positioned in the substantially flat surface of the extruded neck 104.

While such a flange 106 may be of any general shape sufficient to provide adequate surface area for physical connection to the circuit board 108, it must also provide appreciable static stability for maintaining its orientation and placement during the circuit board assembly process. One such shape, shown in FIGS. 1A and 1B for illustration and not limitation, is a generally circular flange 106 wherein flat sections on opposing sides of the periphery of the major diameter of the flange 106 have been provided. Such a discontinuity in the periphery of the flange 106 aids the optical sensors common to most SMT machinery by providing it an angular reference with which it may properly determine the required orientation of the threadplate 100 and thereby place it accordingly. Typically, where the SMT machine's vision system cannot determine an orientation of a component (generally due to the symmetry of the component), it will not perform the placement.

Figure 2:
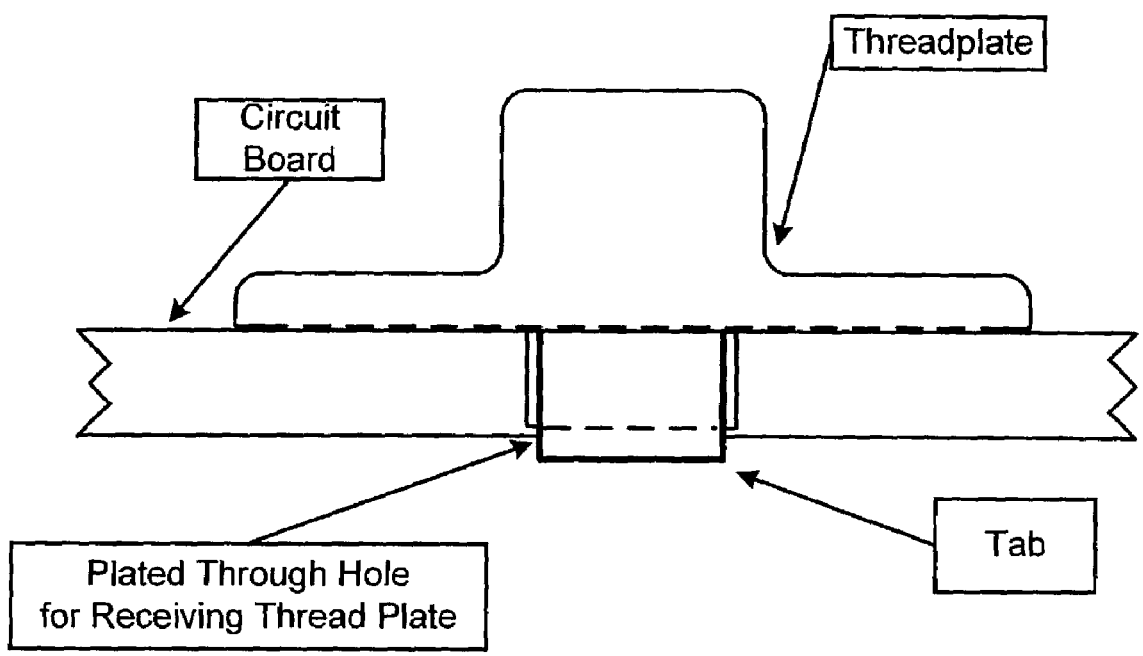
FIG. 2 illustrates a schematic view of an exemplary threadplate fastened to a circuit board, according to one embodiment.

FIG. 2 shows an alternative exemplary embodiment of the present invention in which the threadplate 100 may additionally comprise a tab for use in connecting the threadplate 100 to the circuit board 108. Such tab may extend from any location on the flange 106 and is suitable for insertion into openings, typically plated through holes, in the printed circuit board 108. Such tab may be operable to be either soldered to the underside of the circuit board or folded to lie in a position substantially parallel to an underside of the circuit board 108. It should be noted that alternative embodiments of the present invention may include multiple tabs that may conform to any of the methods of physical attachment of a component to a printed circuit board 108 presently known to those of ordinary skill in the art.

In the present exemplary embodiments, the flange 106 and, if included, the tab(s) may include an area that is prepared for coupling with the circuit board 108. Preferably, the flange 106 and tab(s) are tinned with a material capable of mechanically bonding the flange to the composite material of the circuit board 108. Such tinning may be achieved by either hot dipping such structures (the flange 106 and tab(s)) in solder or by electroplating a thin layer of a compatible material onto them. By way of example, not limitation, such materials include copper, gold, lead, silver, as well as tin and its alloys, particularly tin/lead.

All of the above embodiments provide a threadplate 100 suitable for manufacturing via a stamping or eyelet process. Additionally, the threadplate 100 may be made of any material suitable for withstanding the higher temperatures of the printed circuit board assembly manufacturing process while providing the required structural rigidity needed to serve its design purpose. One such material is cold-rolled steel. Further, such steel threadplate 100 may be electroplated with any suitable materials, including but not limited to tin or a tin alloy.

Further still, the threadplate 100 is suitable for being moved, oriented, positioned and attached using known Surface Mount Technology (SMT) placement machinery. In particular, the present invention is suitable for use with known gripper SMT placement machines. The threadplate 100 has sufficient structural rigidity to be grasped either around the extruded neck 104 or by the flange 106. Similarly, the substantially flat surface at a first end of the extruded neck 104 provides sufficient surface area for the use of high temperature adhesive tape to cover an opening therein and thus makes the present invention suitable for use with known vacuum nozzle equipped SMT placement machines.

Figure 3:
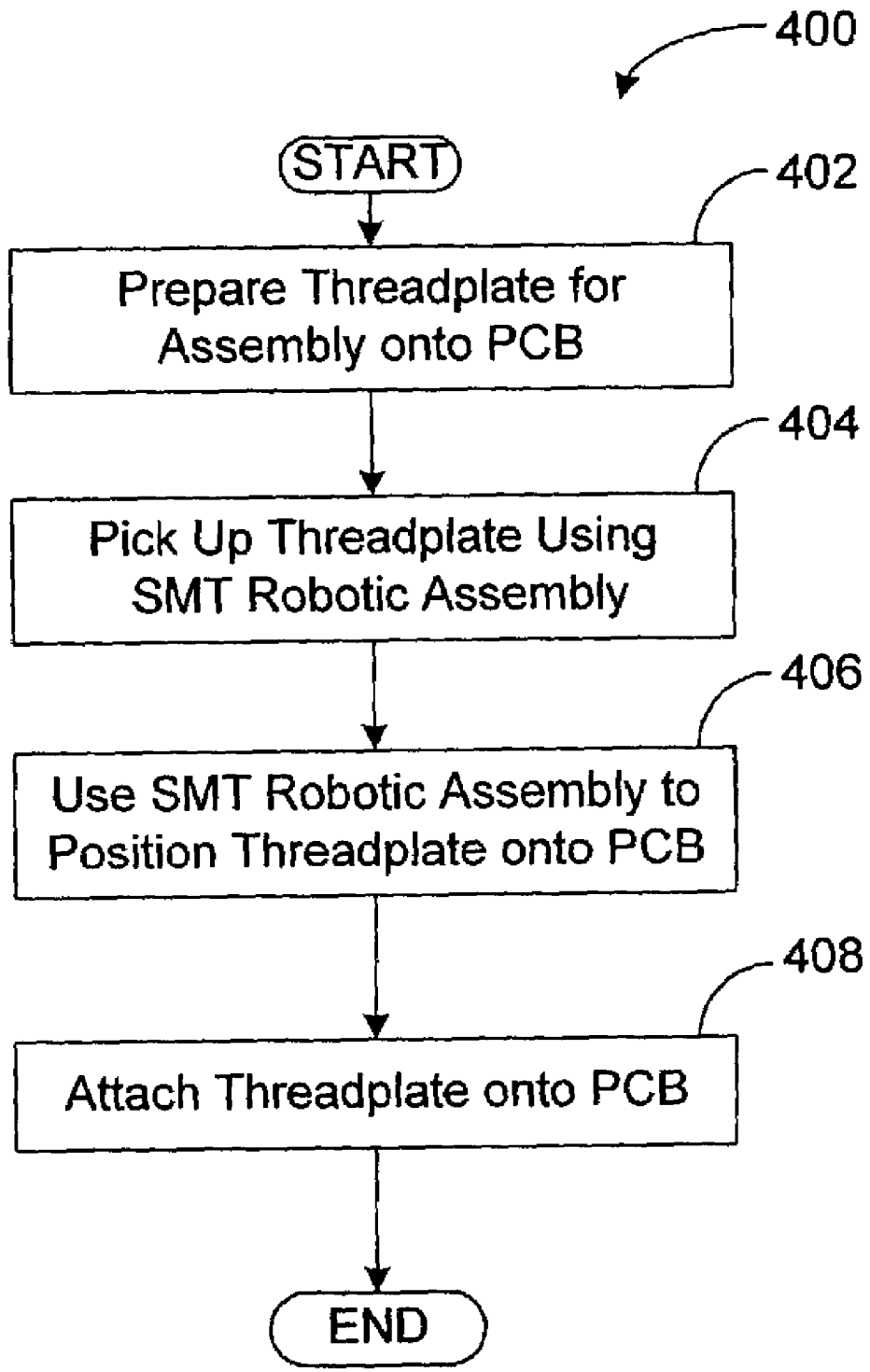
FIG. 3 is a flow chart of an exemplary method of fastening a threadplate to a circuit board using SMT, according to one embodiment.

FIG. 3 illustrates a flowchart of an exemplary method 400 of attaching a threadplate 100 to a circuit board 108 using SMT. Initially, each of the component parts of the circuit board assembly must be prepared for attachment to each other. The circuit board 108 may be prepared for the attachment of the threadplate 100 by silk-screening the printed circuit board with solder paste thus providing a pattern of attachment points (a.k.a. pads) adequate to ensure sufficient contact surface for the placement of the threadplate 100. In those embodiments including at least one tab, the circuit board 108 preparation may include silk-screening both the upper and lower surfaces of the circuit board 108 to provide the necessary solder paste to secure the flange 106 and the at least one tab after its insertion into the corresponding through hole in the circuit board 108.

Similarly, the threadplate 100 may be prepared 402 by tinning a portion of its flange 106 with a material suitable for ensuring a secure mechanical bond to the circuit board 108. Such material may include copper, gold, lead, silver, as well as tin and its alloys, particularly tin/lead. Such tinning may be achieved either by hot-dipping the flange 106 and the at least one tab, if included, in solder or by electroplating a thin layer of the chosen tinning material thereon. Such hot dipping or electroplating serves to provide a clean, oxidation-free metal surface that will provide a superior mechanical bond to the circuit board 108.

Figure 4:
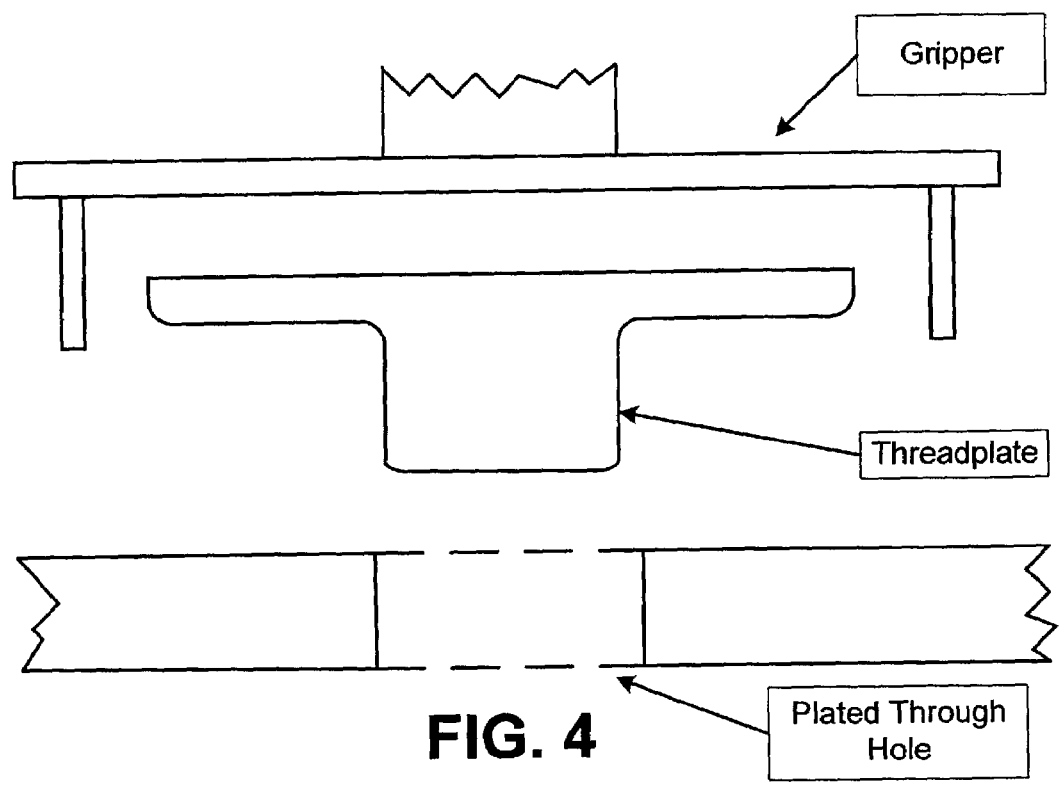
FIG. 4 illustrates a schematic view of an exemplary SMT robotic gripper orienting an exemplary threadplate for placement onto a circuit board.
Figure 5:
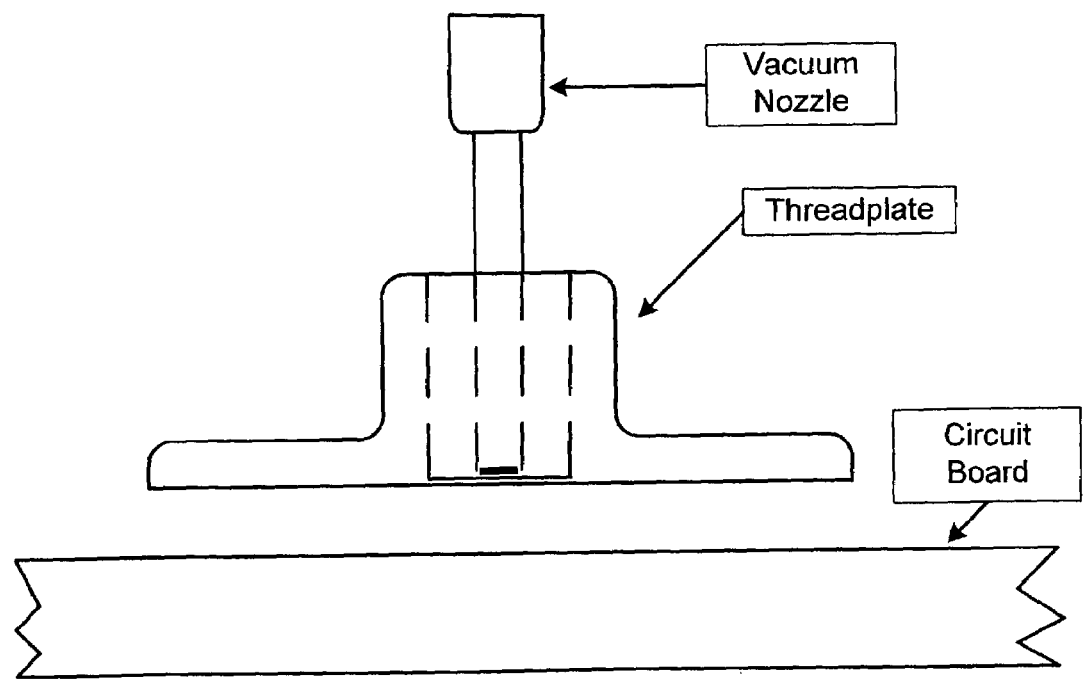
FIG. 5 illustrates a schematic view of an exemplary SMT robotic vacuum nozzle orienting an exemplary threadplate for placement onto a circuit board.

The next steps 404 and 406 in the present exemplary method 400 are moving and orienting the stiffener utilizing a SMT placement machine. All of the presently preferred exemplary embodiments are capable of operating with known grasping or vacuum SMT placement machines. Each such embodiment has sufficient structural rigidity to be grasped either about the elongated section of the extruded neck 104 or as illustrated in FIG. 4, longitudinally by the flange 106. Similarly, as seen in FIG. 5, the opening 112 within the threadplate 100 may be covered with a high temperature adhesive tape capable of withstanding the higher temperatures of the circuit board assembly process. Such tape provides an adequate surface to allow the threadplate 100 to be suitable for placement by a vacuum nozzle-equipped SMT placement machine.

Either of such SMT placement machines is capable of extremely precise placement of electronic components at locations anywhere on the circuit board 108. In the present case, the SMT machines insure proper alignment of the threadplate 100 with their respective solder pads. Where the flange 106 has at least one tab, the SMT machines also insure the passage of the tab(s) into the through hole(s) provided in the circuit board 108.

Finally, the circuit board assembly (CBA), with all its assorted electronic components including the threadplate 100 are processed 408 to complete the mechanical attachment of the parts. The design of the present invention allows for the processing 408 of the CBA either by re-flow soldering or wave soldering of the threadplate 100 to the circuit board 108. In re-flow soldering, the circuit board 108 with all of its components is heated in an oven to produce fusion of the solder in the solder paste, which forms a mechanical bond between the components and the board, including the threadplate 100. Alternatively, a wave soldering process may be used in which the board is passed over a bath of molten solder.

Figure 6:
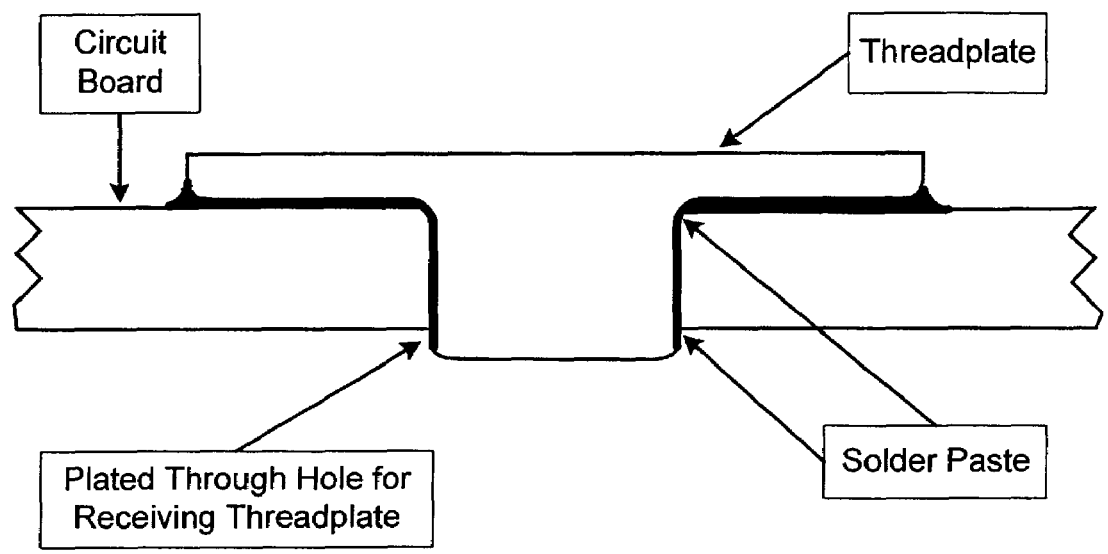
FIG. 6 illustrates a schematic view of an exemplary threadplate fastened to a circuit board, according to another embodiment.
Figure 7:
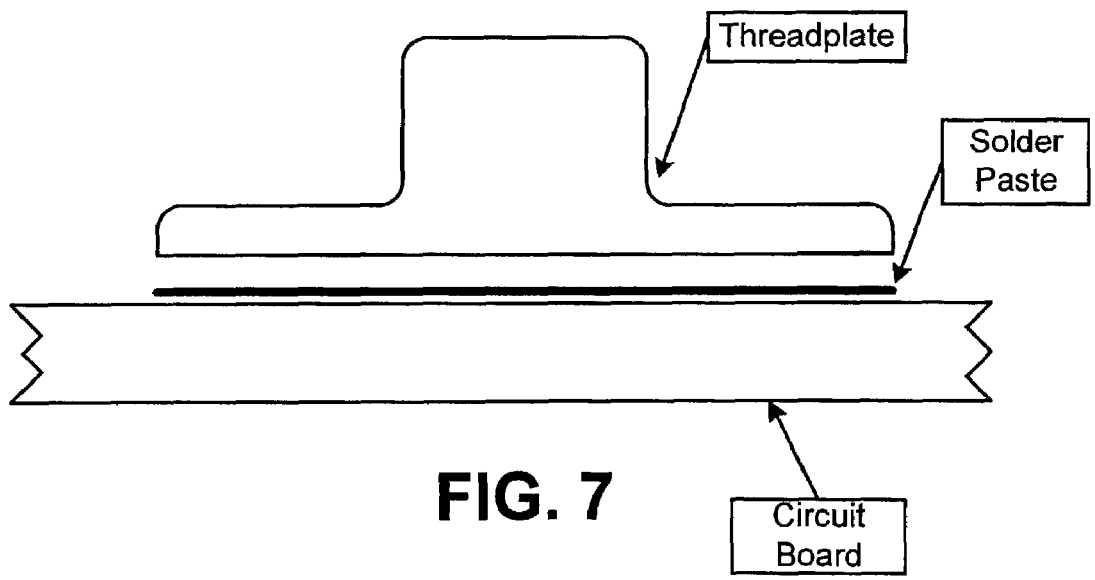
FIG. 7 illustrates a schematic view of an exemplary threadplate positioned to be fastened to a circuit board, according to one embodiment.

FIG. 6 illustrates exemplary solder joints at the points of connection between the present invention and the circuit board 108. Further, enhancing the mechanical strength of the bond between the threadplate 100 and the circuit board 108 is the formation of fillets in the solder joints therebetween. In particular a wave soldering process allows for the wicking of the melted solder paste into the through holes, as well as filling in the right angle interactions between the circuit board 108 and the flange 106, tab or both. The additional material at these right angle interactions typically form in smoothly-radiused curves known as fillets which aid in enhancing the mechanical strength of the bond between the circuit board 108 and the present invention.

FIGS. 1A, 2, 5 and 7, as well as, FIGS. 1B, 4 and 6, depict alternative exemplary methods of attaching such a threadplate 100 to a circuit board 108. FIGS. 1A, 2, 5 and 7 illustrates a first method in which the generally flat surface of the flange 106 may be soldered to a surface of a circuit board 108 and said elongated section of such extruded neck 104 extends upward from such surface of said circuit board 108. The opening 112 may be located in the substantially flat surface of such elongated section of the extruded neck 104 thus providing access to the cylindrical cavity 110 positioned inside the substantially cylindrical member 102. An electronic component may be coupled to the threadplate 100 by way of any of the methods of physical attachment of such components known to those of ordinary skill in the art, including but not limited to soldering, gluing, or by the automated use of screws, rivets or grommets.

FIGS. 1B, 4, and 6 depict an alternative method of physical attachment of the threadplate 100 to a circuit board 108 in which the extruded neck 104 may be inserted into a corresponding through hole provided in the circuit board 108. Such through hole may be plated so as to allow electrical connection between components on opposing sides of the same circuit board or to aid in making electrical connection between associated circuit boards. In the present exemplary method of use, the elongated section of the extruded neck 104 and a surface of the flange 106 may be soldered to the circuit board 108 for a secure physical connection between the two either by re-flow or wave soldering as discussed above.

As the threadplate 100 is capable of mounting in an inverted manner, the location of the access to the generally cylindrical cavity 110 by way of the opening 112 is necessarily flexible. In one exemplary embodiment, the opening 112 may be in the substantially flat surface of the flange 106. In an alternative exemplary embodiment, the opening 112 may be located on the substantially flat surface of the extruded neck 104. Further still, the substantially cylindrical cavity 110 may extend either all of the way through the threadplate 100 or only partially therethrough as needed.

Although a preferred embodiment of the invention has been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged both in whole or in part. Therefore, the spirit and scope of the appended claims should not be limited to the description of the preferred version contained herein.

What is claimed is:

1. A circuit board threadplate comprising:
   a hollow substantially cylindrical member forming an extruded neck, the extruded neck having an elongated section operable to be fitted through an opening in a circuit board and a substantially flat surface at a first end of the elongated section;
   a relatively thin, plate-like flange extending from a second end of the elongated section, the second end substantially opposite the first end of the elongated section, wherein, in operation, the elongated section is fitted through the opening in the circuit board in a first direction and at least a portion of the circuit board forms a plane between the first end of the elongated section and the second end of the elongated section, the flange providing substantially flat top and bottom surfaces suitable for soldering onto a surface of the circuit board, the flange being relatively thin as measured from the substantially flat top surface to the substantially flat bottom surface relative to the extruded neck from the first end of the elongated section to the second end of the elongated section, the flange being in a generally circular shape with flat sections on opposing sides forming a discontinuity in the periphery of the flange that is detectable by most surface mount technology (SMT) machinery and providing an angular reference, wherein the angular reference aids optical sensors common to most SMT machinery;
   a cylindrical cavity positioned inside the substantially cylindrical member, the cylindrical cavity generally extending in a direction aligned with the substantially cylindrical member, the cylindrical cavity having a thread pattern suitable for receiving a screw-type fastener; and
   an opening providing access to the cylindrical cavity in the first direction.

2. The threadplate of claim 1, wherein the opening is positioned in a side of the flange opposite the extruded neck.

3. The threadplate of claim 1, wherein the opening is positioned in the substantially flat surface of the extruded neck.

4. The threadplate of claim 1, wherein the cylindrical cavity extends through the flange and the substantially flat surface of the extruded neck.

5. The threadplate of claim 1 further comprising a tab extending from a section of the flange, the tab suitable for insertion into an opening in the circuit board.

6. The threadplate of claim 5, wherein the tab is operable to be soldered to an underside of the circuit board.

7. The threadplate of claim 5, wherein the tab is operable to be folded to lie in a position substantially parallel to an underside of the circuit board.

8. The threadplate of claim 1, wherein the flange is suitable for grasping by a SMT placement machine.

9. The threadplate of claim 1, wherein the extruded neck is suitable for grasping by a SMT placement machine.

10. The threadplate of claim 1, wherein the cylindrical cavity does not extend through the substantially flat surface of the extruded neck.

11. The threadplate of claim 1, wherein the cylindrical cavity does not extend through a bottom side of the flange.

12. The threadplate of claim 1, wherein the threadplate is electroplated with tin alloys.

13. The threadplate of claim 1 further comprising a circuit board insertion tab extending from a section of the flange.

14. A circuit board threadplate as recited in claim 1 wherein the circuit board has at least one hole suitable for the threadplate.

15. A circuit board threadplate as recited in claim 14 wherein the cylindrical cavity extends through the flange and the substantially flat surface of the extruded neck.

* * * * *